(12) United States Patent
Furtner

(10) Patent No.: US 8,872,505 B2
(45) Date of Patent: Oct. 28, 2014

(54) ACCESSORY PRESENCE DETECTION

(75) Inventor: Wolfgang Furtner, Fuerstenfeldbruck (DE)

(73) Assignee: Infineon Technologies AG, Neubiberg (DE)

( * ) Notice: Subject to any disclaimer, the term of this patent is extended or adjusted under 35 U.S.C. 154(b) by 715 days.

(21) Appl. No.: 12/914,261

(22) Filed: Oct. 28, 2010

(65) Prior Publication Data

US 2012/0105051 A1    May 3, 2012

(51) Int. Cl.
*G01R 19/00* (2006.01)
*G01R 19/145* (2006.01)
*H03K 5/19* (2006.01)

(52) U.S. Cl.
CPC ........................................ *H03K 5/19* (2013.01)
USPC ..................................... 324/123 R; 324/76.1

(58) Field of Classification Search
CPC ...... G01R 17/16; G01R 1/30; G01R 19/0023; G01R 19/02; G01R 19/0092; G01R 1/203; G01R 31/2642; H03F 3/36; G06F 9/3802

USPC ....................................................... 324/123 R
See application file for complete search history.

(56) References Cited

U.S. PATENT DOCUMENTS

| | | | |
|---|---|---|---|
| 5,212,456 A * | 5/1993 | Kovalcik et al. | 330/261 |
| 6,819,094 B2 * | 11/2004 | Barcelo et al. | 323/316 |
| 7,459,886 B1 * | 12/2008 | Potanin et al. | 320/135 |
| 7,982,431 B2 * | 7/2011 | Kokubun et al. | 320/128 |
| 2005/0007075 A1 * | 1/2005 | Woo et al. | 320/148 |
| 2007/0182375 A1 * | 8/2007 | Lee | 320/130 |
| 2010/0008108 A1 * | 1/2010 | Xiaowu et al. | 363/21.15 |
| 2010/0033237 A1 * | 2/2010 | Liang et al. | 327/543 |
| 2011/0050343 A1 * | 3/2011 | Jurasek et al. | 330/261 |
| 2011/0127950 A1 * | 6/2011 | Veselic | 320/107 |

* cited by examiner

*Primary Examiner* — Patrick Assouad
*Assistant Examiner* — Hoang X Nguyen
(74) *Attorney, Agent, or Firm* — Slater & Matsil, L.L.P.

(57) ABSTRACT

Disclosed is an electronic circuit with a first terminal for connecting an accessory thereto, and with a functionality for detecting the presence of an accessory connected to the first terminal.

25 Claims, 7 Drawing Sheets

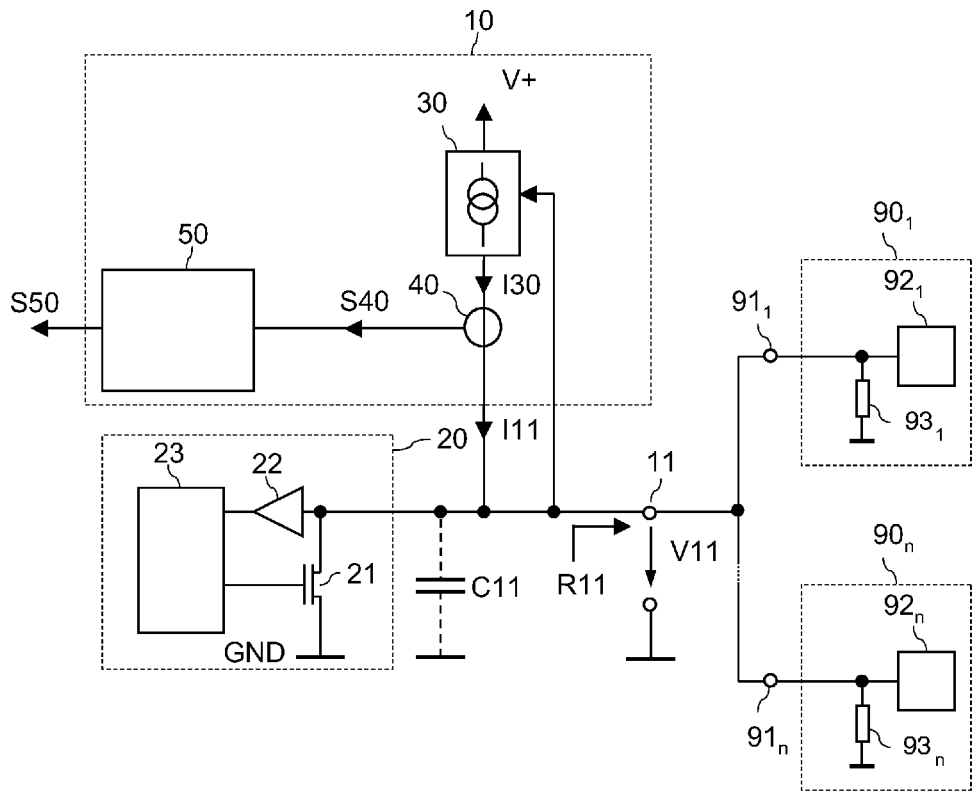
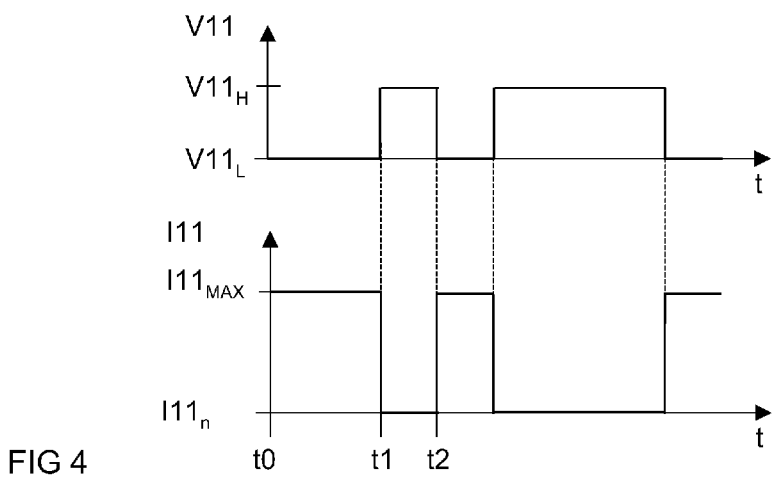
FIG 3
FIG 4

ACCESSORY PRESENCE DETECTION

TECHNICAL FIELD

Embodiments of the present invention relate to a circuit and to a method for detecting the presence of an accessory connected to the circuit.

BACKGROUND

Many electronic devices include a removable accessory or component. A removable component is, for example, a battery in a mobile or portable device, like a mobile phone, a personal digital assistant, a mobile computer, a photo camera or a video camera; or an ink or toner cartridge in a printer or copier. To provide a proper function of the electronic device, it is necessary to detect whether a component is connected thereto, and if several components, like batteries, can be connected to the electronic device, how many components are connected thereto.

Some types of components have a communication interface which allows a communication or information transfer between the component and the electronic device. Such information may include authentication information which allows the electronic device to verify that the component is suitable and authorized to be used with the electronic device; operation parameters of the component, like the temperature (measured by a temperature sensor), or the charging state of a battery or the filling level of an ink or toner cartridge.

Some electronic devices are very small, so that space is an issue, and thus it is desirable to use only one port or terminal of the electronic device to provide both presence detection and communication, for cost reasons and for space reasons.

SUMMARY OF THE INVENTION

A first embodiment relates to an electronic circuit, that includes a first terminal for connecting an accessory. A transmitter or receiver circuit is connected to the first terminal. A controlled current source includes an output coupled to the first terminal and is configured to drive a current into the first terminal which is dependent on an electrical potential at the first terminal. A current measurement circuit is configured to measure a current at the first terminal and to provide a current measurement signal which is representative of the current at the first terminal. An evaluation circuit receives the current measurement signal and is configured to generate a detection signal dependent on the measurement signal.

A second embodiment relates to a method for detecting the presence of an accessory connected to a first terminal of an electronic device. The method includes driving a current into the first terminal dependent on an electrical potential at the first terminal. A current is measured at the first terminal and a detection signal is generated dependent on the current measured at the first terminal.

BRIEF DESCRIPTION OF THE DRAWINGS

Examples will now be explained with reference to the drawings. The drawings serve to illustrate the basic principles, so that only aspects necessary for understanding the basic principles are illustrated. The drawings are not to scale. In the drawings the same reference characters denote like features.

FIG. 3 illustrates a first embodiment of a presence detection circuit configured to detect the presence of an accessory connected to the electronic device, the presence detection circuit including a controlled current source, a current measurement circuit and an evaluation circuit;

FIG. 4 illustrates the operating principle of the presence detection circuit;

DETAILED DESCRIPTION OF ILLUSTRATIVE EMBODIMENTS

Figure 1:
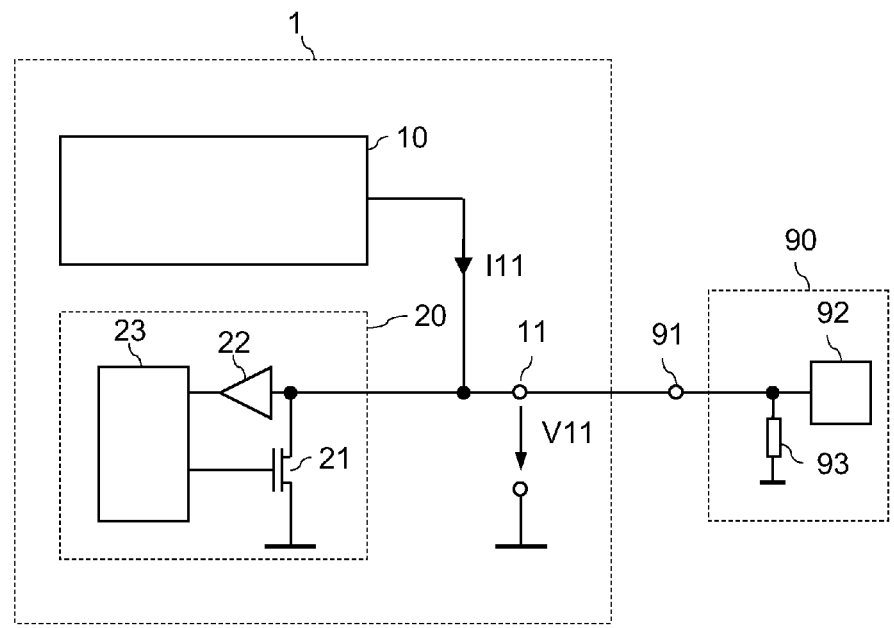
FIG. 1 schematically illustrates an electronic device and an accessory which is coupled to the electronic device and which is configured to communicate with the electronic device.

FIG. 1 schematically illustrates an electronic device 1 which is configured to have at least one accessory or component 90 connected to a first terminal 11. The electronic device is, for example, a portable device, like a mobile phone, a personal digital assistant (PDA), a mobile computer, or a photo camera, and the removable component 90 is, for example, a battery. According to a further embodiment, the electronic device 1 is a printer or a copier, and the accessory or removable component is an ink or toner cartridge. The electronic device 1 includes a first terminal 11 to which the removable component 90 can be connected to. This first terminal 11 has two functions: it serves as a data communication port which allows a data communication between the electronic device 1 and the at least one removable component 90; and it detects the presence of at least one removable component 90 connected to the electronic device 1.

Embodiments of the present invention relate to the detection of the presence of a removable component 90 connected to the electronic device 1. Thus, in the drawings, besides circuits that perform a data communication, only circuitry required for such presence detection, and only those connections between the electronic device 1 and the removable component 90 required for such presence detection are illustrated. It goes without saying that the electronic device includes a plurality of additional circuit components, and that the removable component includes a plurality of additional circuit components and other components. Further, there can be additional connections between the electronic device 1 and the removable component 90, like a power supply connection. Through such power supply connection the removable component may power the electronic device 1, like when the removable component 90 is a battery, or the electronic device 1 can power the removable component 90, like when the removable component 90 is an ink or toner cartridge.

Both, the detection of the presence of a removable component 90 connected to the electronic device 1, and a data communication between the electronic device 1 and the removable component 90 (if one is connected to the electronic device 1), are required for the electronic device 1 to function properly.

The electronic device 1 includes a presence detection circuit 10 and a communication circuit 20 both connected to the first terminal 11. The presence detection circuit 10 serves to detect the presence of a removable component 90 connected to the first terminal 11, and the communication circuit 20 is configured to communicate with the component 90 via the first terminal 11. The removable component 90 includes: a communication and presence detection terminal 91 which is configured to be connected to the first terminal 11 of the electronic device, a communication circuit 92 connected to the communication and presence detection terminal 91, and a passive electronic component 93, like a resistor, connected to the communication and presence detection terminal 91. The communication circuit 92 of the removable component 90 is configured to communicate with the communication circuit 20 of the electronic device 1 via the first terminal 11, and the passive electronic component 93 allows the presence detection circuit 10 to detect the presence of the removable component 90 by evaluating the electrical resistance at the first terminal 11. The communication circuits 20, 92 can be implemented like conventional communication circuits which are configured to perform a data communication via a single connection line, such as the connection line between the first terminal 11 of the electronic device 1 and the communication and presence detection terminal 91 of the removable component 90. The communication protocol used by these communication circuits 20, 92 can be a conventional communication protocol for a single-line data communication.

During a data communication, one of the communication circuits 20, 92 acts as a transmitter, while the other one acts as a receiver. The communication circuits 20, 92 can be implemented such that they have both functionalities, so that each communication circuit alternatingly can act as a transmitter and receiver circuit. However, it is also possible to implement one of the communication circuits 20, 92 as a transmitter circuit only, and the other one of the communication circuits 20, 92 as a receiver circuit only. For signal transmission purposes the communication circuit 20, 92 acting as a transmitter modulates a voltage V11 at the first terminal 11 such that this voltage V11 alternatingly assumes one of a first and second signal levels. This voltage V11 will be referred to as an output voltage in the following. The information to be transmitted is, for example, defined by the duration for which the individual signal levels of the output voltage V11 occur. This will be explained with reference to FIG. 2.

Figure 2:
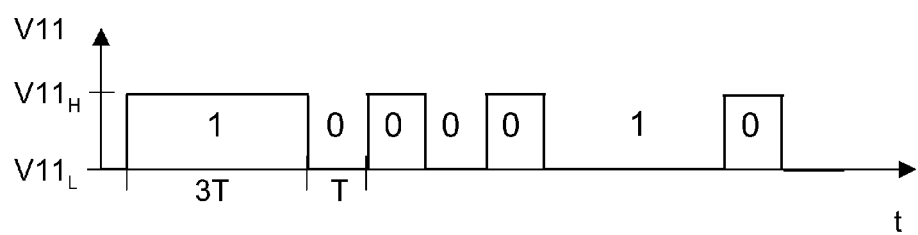
FIG. 2 schematically illustrates a communication protocol for a communication between the electronic device and the accessory.

FIG. 2 schematically illustrates a timing diagram of the output voltage V11 during data transmission. As can be seen from FIG. 2, the transmitter circuit modulates the voltage V11 to alternate between a first signal level $V11_L$ and a second signal level $V11_H$. In the embodiment illustrated in FIG. 2, the first signal level $V11_L$ is represented by a lower voltage than the second signal level $V11_H$. However, this is only an example, the first signal level $V11_L$ could also be higher than the second level. The modulated output voltage V11 represents a sequence of first and second bit values, like logical ones (1) and zeros (0). In this embodiment, the information to be transmitted is mapped onto the duration for which the individual signal values occur. A logical "1" is represented by a long duration, while a logical "0" is represented by a short duration. In the embodiment illustrated in FIG. 2, the "long duration" includes three clock cycles T, while the "short duration" includes one clock cycle T. In this method, the receiver circuit simply measures the durations for which the individual signal levels occur of the output voltage V11 at the first terminal 11 in order to demodulate the transmitted signal, i.e., in order to retrieve the data word transmitted by the transmitter circuit 20 or 92.

The presence detection circuit 10 is configured to measure the impedance at the first terminal 11 in order to detect whether a removable component 90 with an internal impedance 93 is connected to the first terminal 11, and if several components can be connected in parallel to the first terminal 11, how many of these removable components 90 are connected to the first terminal 11. The impedance measured at the first terminal 11 is the input impedance of the removable component(s) connected to the first terminal 11.

A first embodiment of the presence detection circuit 10 is illustrated in FIG. 3. For illustration purposes, FIG. 3 also illustrates an embodiment of the communication circuit 20. In this embodiment, the communication circuit 20 includes a modulation transistor 21 connected between the first terminal 11 and a terminal for a first supply potential or reference potential GND, such as ground. This modulation transistor 21 serves to modulate the output voltage V11 when the communication circuit 20 acts as a transmitter. The control circuit 23 further includes an input terminal coupled to the first terminal 11. Via this input terminal the control circuit 23 receives the output voltage V11 in order to demodulate the output voltage V11 and to retrieve the information included in the output voltage V11 when the communication circuit 20 acts as a receiver.

The communication circuit 92 in the at least one removable component 90 can be implemented in the same way as the communication circuit 20 in the electronic device. In this connection it should be mentioned that the specific implementation of the communication circuit 20 illustrated in FIG. 3 is only an example. This communication circuit 20 can be a conventional transmitter and/or receiver circuit suitable for data communication via a single line. The communication circuit 20 illustrated in FIG. 3 is implemented as a transceiver, i.e. this communication circuit alternatingly may act as a transmitter which is configured to modulate the voltage V11 at the first terminal 11, or as a receiver which is configured to receive/detect the output voltage V11 at the first terminal 11. Dependent on the specific type of electronic device it is also possible to implement the communication circuit 20 as a transmitter only, or as a receiver only. In the latter case the output voltage V11 at the first terminal 11 can be modulated by the communication circuit 92 in the at least one removable component 90.

In the circuit of FIG. 3, the output voltage V11 at the first terminal 11 assumes the first (low) signal level $V11_L$ when a modulation transistor, like transistor 21, in one of the communication circuits, like circuit 20, is switched on. For explanation purposes it can be assumed that the voltage drop across the modulation transistor 21 can be neglected when this transistor 21 is in its on-state. In this case, the first signal level $V11_L$ at least approximately equals the first supply potential GND. In order to obtain the second (high) signal level $V11_H$ at the first terminal 11 the modulation transistor 21 is switched off.

The electronic device and the at least one removable component connected to the electronic device include parasitic capacitances connected or coupled to the first terminal 11. In FIG. 3, these parasitic capacitances are represented by capacitor C11 connected between the first terminal 11 and the terminal for the first supply potential GND. When the modulation transistor of one of the communication circuits, like modulation transistor 21 of communication circuit 20, is switched off, this parasitic capacitance C11 has to be charged for the output voltage V11 to rise to the second (higher) signal level $V11_H$. Further, in order for the output voltage V11 to rise to the second signal level $V11_H$ a current flow through the impedance of the at least one removable component is required. For illustration purposes, in FIG. 3 two removable components $90_1$, $90_n$ are shown to be connected in parallel to the first terminal 11. Each of these removable components $90_1$, $90_n$ includes an impedance $93_1$, $93_n$ and a communication circuit $92_1$, $92_n$.

A current required at the first terminal 11 for the output voltage V11 to rise is provided by the presence detection circuit 10. This detection circuit 10 includes a controlled current source 30, a current measurement circuit 40, and an evaluation circuit 50. The controlled current source 30 includes a current output at which an output current I30 is provided and which is coupled to the first terminal 11. The controlled current source 30 is configured to drive a first current I11 into the first terminal 11, wherein the first current is supplied by the output current I30 of the current source 30 and may be equal to this output current.

The current measurement circuit 40 is configured to measure the first current I11 at the first terminal 11 and to provide a current measurement signal S40 which is dependent on the measured current I11. The evaluation circuit 50 receives the current measurement signal S40 and provides a status signal or presence detection signal S50. This status signal S50 indicates whether or not a removable component is connected to the electronic device and, if several components can be connected to the electronic device, how many removable components are connected thereto.

The controlled current source 30 provides the first current I11 dependent on the electrical potential V11 at the first terminal 11. According to one embodiment, the controlled current source 30 provides the first current I11 such that it is selected from a current range ranging from a minimum current value $I11_{MIN}$ to a maximum current value $I11_{MAX}$ and such that the voltage V11 at the first terminal 11 is limited to a given maximum voltage value. According to one embodiment, this maximum voltage value corresponds to the second signal value $V11_H$, and the controlled current source 30 provides the maximum first current $I11_{MAX}$ when the voltage V11 at the first terminal 11 is below the second signal level $V11_H$. In other words: the controlled current source 30 is configured to control the voltage V11 at the first terminal 11 such that this voltage assumes the second signal level $V11_H$, wherein the first current I11 has its maximum value $I11_{MAX}$ when this voltage V11 is below the second signal level $V11_H$.

The basic operating principle of the detection circuit 10 will now be explained with reference to FIG. 4 in which timing diagrams of the output voltage V11 and the first current I11 are illustrated. The timing diagrams in FIG. 4 start at time t0 at which the voltage V11 has the first signal level $V11_L$, e.g., because the modulation transistor of one of the communication circuits connected to the first terminal 11 is switched on. At this time the maximum first current $I11_{MAX}$ is provided by the control current source 30 at the first terminal 11. The switched-on modulation transistor bypasses or short-circuits the impedances of the removable components, like the impedances $91_1$, $91_n$ of FIG. 3, so that even the maximum current $I11_{MAX}$ can not pull-up the voltage V11 at the first terminal 11 to the second signal level $V11_H$. At time t1 the modulation transistor is switched off. The maximum first current $I11_{MAX}$ which at this time is still provided by the controlled current source 30 causes the voltage V11 at the first terminal 11 to rise, wherein the controlled current source 30 reduces the first current I11 to a lower current $I11_n$ when the second signal level $V11_H$ is reached, in order to limit the voltage V11 to the second signal level $V11_H$. This lower first current $I11_n$ is dependent on the impedance at the first terminal 11, i.e., the overall input impedance at of the removable component(s). This impedance is dependent on whether there is a removable component connected to the first terminal 11 and, when there is a removable component connected to the terminal 11, is dependent on how many of these removable components are connected in parallel to the terminal 11. For explanation purposes it may be assumed that more than one removable component can be connected to the terminal 11, and that each of these removable components includes a resistor as a detection impedance having a resistance value of R93. For explanation purposes it may further be assumed that n, with n≥1, removable components are connected to the electronic device. In this case, a resistance R11 "seen" at the first terminal 11 is:

$$R11 = \frac{R93}{n} \tag{1}$$

The first current $I11_n$ required at the first terminal 11 to adjust the voltage V11 to the second signal level $V11_H$, therefore, is:

$$I11_n = \frac{V11_H}{R93} \cdot n \tag{2}$$

The current $I11_n$ provided by the controlled current source 30 at the first terminal 11 is, therefore, directly dependent on the number of removable components connected to the first terminal 11, wherein the first current I11 is zero when no (n=0) component is connected to the first terminal 11. When one of the modulation transistors is switched on, which is illustrated at time t2 in FIG. 4, the controlled current source 30 increases the output current I30 trying to keep the voltage V11 at the second signal level $V11_H$ until the first current I11 again reaches the maximum current $I11_{MAX}$.

The controlled current source 30 of FIG. 3 acts like a voltage regulator which is configured to control the output voltage such that it assumes the second signal level and which is configured to provide a maximum first current $I11_{MAX}$ at the first terminal. Of course, any other type of voltage regulator may be used as well instead of the controlled current source 30 illustrated in FIG. 3.

Referring to FIG. 4, the first current I11 provided by the controlled current source 30 assumes its maximum $I11_{MAX}$ when the output voltage V11 is pulled down by one of the communication circuits connected to the first terminal 11. During these time periods the first current I11 is not suitable for detection purposes; in this case, the detection circuit 10 is not in a presence detection mode. When none of the communication circuits pulls down the output voltage V11, the current I11, referring to equation (2), is representative of the number of removable components connected to the first terminal 11, in this case, the detection circuit is in a presence detection mode. The evaluation circuit 50 is configured to evaluate the current measurement signal S40, which represents the current I11, during these time periods. According to one embodiment, the evaluation circuit 50 is configured to evaluate the current measurement signal S40 only during those time periods in which the output current I11 is less than the maximum $I11_{MAX}$.

Figure 5:
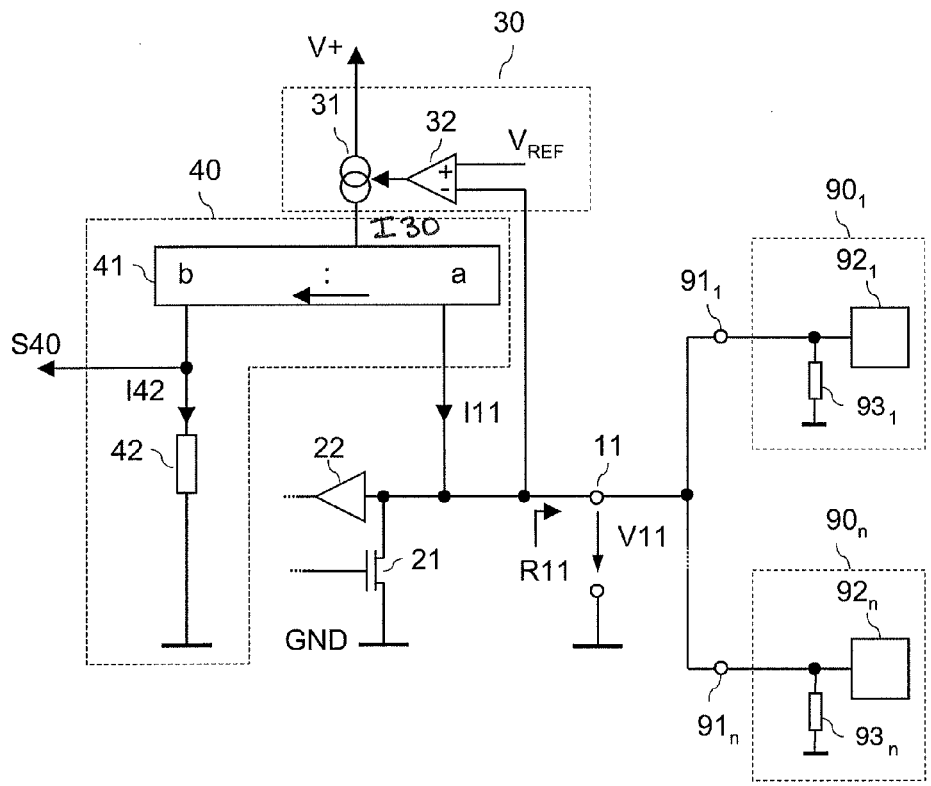
FIG. 5 illustrates a first embodiment of the controlled current source and the current measurement circuit.

FIG. 5 illustrates a first embodiment of the controlled current source 30 and a first embodiment of the current measurement circuit 40. For illustration purposes, the modulation transistor 21 and the optional input buffer 22 of the communication circuit 20 are also illustrated in FIG. 5. The controlled current source 30 of FIG. 5 includes a controllable current source 31 having a current output coupled to the first terminal 11, and a control input. The controlled current source 30 further includes a feedback loop coupled between the first terminal 11 and the control input of the controllable current source 31 for controlling the first current I11 dependent on the output voltage V11. The output current I30 of the controlled current source 30 corresponds to the output current of the controllable current source 31. The feedback loop, in this embodiment, includes an amplifier, like an operational amplifier, which receives the output voltage V11 at a first input terminal, and a reference voltage VREF which represents the second signal value V11H at a second input. Alternatively, a signal proportional to the first voltage V11 can be provided to the first input of the amplifier 32 instead of the first voltage V11. An output of the amplifier 32 is connected to the control input of the controllable current source 31. The controllable current source 31 is configured to provide the output current I30 and, therefore, the first current I11 is dependent on the amplifier 32 output signal.

The current measurement circuit 40 of FIG. 5 includes a first current mirror 41 with an input current path connected between the current source 30 and the first terminal 11, and with an output current path connected between the current source 30 and a measurement resistor 42. The first current mirror 41 is configured to provide an output current I42 at the measurement resistor 42 which is proportional to the first current I11 flowing through the input current path. In this embodiment, the first current I11 is proportional to the output current I30 of the controlled current source 30. For explanation purposes it may be assumed that the current mirror has a current mirror ratio of a:b so that $$b \cdot I42 = a \cdot I11 \quad (3).$$

In this case, the first current I11 is dependent on the output current I30 of the current source 30 as follows:

$$I11 = I30 \cdot \frac{a}{a+b}. \quad (4)$$

In the current measurement circuit 40 of FIG. 5, the current measurement signal S40 corresponds to the voltage across the measurement resistor 42, i.e., $$S40 = I42 \cdot R42 \quad (5),$$

wherein R42 is the resistance of the measurement resistor.

Since, referring to equation (3), the output current I42 of the first current mirror 41 is proportional to the first current I11 at the first terminal 11, the current measurement signal S40 is proportional to the current I11 at the first terminal 11. When the detection circuit is in the presence detection mode, the first current I11, referring to equation (2), is proportional to the number of removable components connected to the output terminal 11. Thus, by evaluating the current measurement signal S40 the number of removable components connected to the first terminal 11 can be evaluated.

In the circuit illustrated in FIG. 5, the output of the current source 30 is coupled to the first terminal 11 via the input current path of the first current mirror 41, so that the controlled current source 30 provides both currents, the first current I11 at the first terminal 11, and the output current I42 of the current mirror; these currents I11, I42 are proportional. In this case, the first current I11 is less than the output current I30 of the current source 30.

Figure 6:
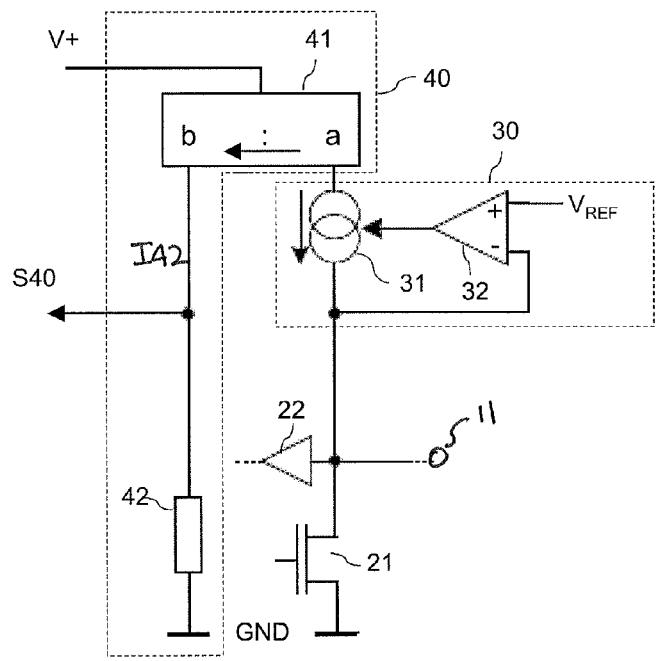
FIG. 6 illustrates the controlled current source and the current measurement circuit of FIG. 5 arranged in a different way.

FIG. 6 illustrates a further embodiment of the controlled current source 30 and the current measurement circuit 40. Like in the embodiment of FIG. 5 the controlled current source 30 includes a controllable current source 31 and a feedback loop with an amplifier 32, and the current measurement circuit 40 includes a first current mirror 41 and a measurement resistor 42 connected to an output of the current mirror 41. In this embodiment, the controlled current source 30 is directly connected to the first terminal 11, so that the output current I30 of the current source 30 corresponds to the first current I11. The current mirror 41 is connected between the terminal for the second supply potential V+ and the current source 30, wherein the current source 30 defines the current through the input current path of the current mirror 41. The relationship between the output current I42 of the current mirror and the current I11 at the first terminal 11 is also given by equation (3). The difference between the circuits of FIGS. 5 and 6 is, that in the circuit of FIG. 6 only the first current I11 is provided by the controlled current source 30, while in the circuit of FIG. 5, the controlled current 30 source provides the first current I11 and the measurement current I42.

Controllable current sources, like the current source 31 in FIGS. 5 and 6, and current mirrors, like the first current mirror 41 in FIGS. 5 and 6, are commonly known, so that no further explanations are required in this regard. The current mirror 41 can be implemented in a conventional fashion, like as a current mirror with a pair of transistors, as a Wilson current mirror, or as a current mirror with an OPV. The transistors in the current mirror can be implemented as MOS-transistors or bipolar transistor, and as n-type or p-type or npn-type or pnp-type transistors, respectively.

Nevertheless, some examples for implementing the controllable current source 31 and the current mirror 41 will be explained with reference to FIGS. 7 and 8. In the embodiment illustrated in FIG. 7, the first current mirror 41 is implemented like a conventional current mirror and includes two transistors: an input transistor 411, connected as a diode, and an output transistor 412. Each of the two transistors 411, 412 have a load path and a control terminal, wherein the control terminals of the two transistors 411, 412 are connected with each other. The load path of the input transistor 411 forms the input current path, and the load path of the output transistor 412 forms the output current path of the first current mirror 41. In this embodiment, the first current mirror 41 is connected between the controllable current source 31 and the first terminal 11, wherein the input current path of the first current mirror 41 is connected between the output of the controlled current source 31 and the first terminal 11. The output current path of the first current mirror 41 is connected between the controllable current source 31 and the measurement resistor 42. In the embodiment illustrated in FIG. 7, the two transistors 411, 412 are implemented as p-type transistors. However, this is only an example, these two transistors in another current mirror configuration and/or when the polarity of the supply voltage is reversed could also be implemented as n-type transistors.

In this embodiment, the controllable current source 31 includes a second current mirror with an input current path connected in series with a reference current source 316 and an output current path connected in series with the first current mirror 41 and connected between the terminal for the second supply potential V+ and the first current mirror 41. The second current mirror includes an input transistor 311 and an output transistor 312, each including a load path and a control terminal, wherein the control terminals of the two transistors 311, 312 are connected together, and wherein the load path of the input transistor 311 forms the input current path and the load path of the output transistor 312 forms the output current path of the second current mirror. The input transistor 311 is connected as a gated diode, i.e., has its control terminal (gate terminal) connected to one of its load terminals (source terminal). A reference current source 316 connected in series with the input current path generates a reference current $I_{REF}$ which flows through the input current path. This reference current $I_{REF}$ defines the maximum output current $I30_{MAX}$ of the controlled current source 30. The maximum output current $I30_{MAX}$ is proportional to the reference current $I_{REF}$, wherein a proportionality factor between these two currents $I30_{MAX}$, $I_{REF}$ is defined by the current mirror ratio of the second current mirror. This ratio is defined in a conventional manor by the sizes or the ratio of the W/L-ratios of the input and the output transistors 311, 312. Likewise, the current mirror ratio of the first current mirror 41 is also defined by the ration of the W/L-ratios of the input and the output transistors 411, 412.

To be able to reduce the output current I30 of the controlled current source 30 to values below the maximum $I30_{MAX}$ a current control transistor 313 has its load path connected between the control terminal and one of the load path terminals of the output transistor 312. This control transistor 313 is operated in the linear region of its characteristic curve. The conductivity of this transistor 313 is controlled by the output signal of the amplifier 32, wherein with increasing conductivity of the control transistor 313 the conductivity of the output transistor 312 is decreased, so that the output current I30 decreases. When the voltage V11 at the first terminal 11 is smaller than the reference voltage $V11_H$ the control transistor 313 is switched off. In this case, the control transistor 313 does not influence the operation of the second current mirror, so that in this operating point of the circuit the output current I30 equals the maximum $I30_{MAX}$, which is proportional to the reference current $I_{REF}$.

Figure 7:
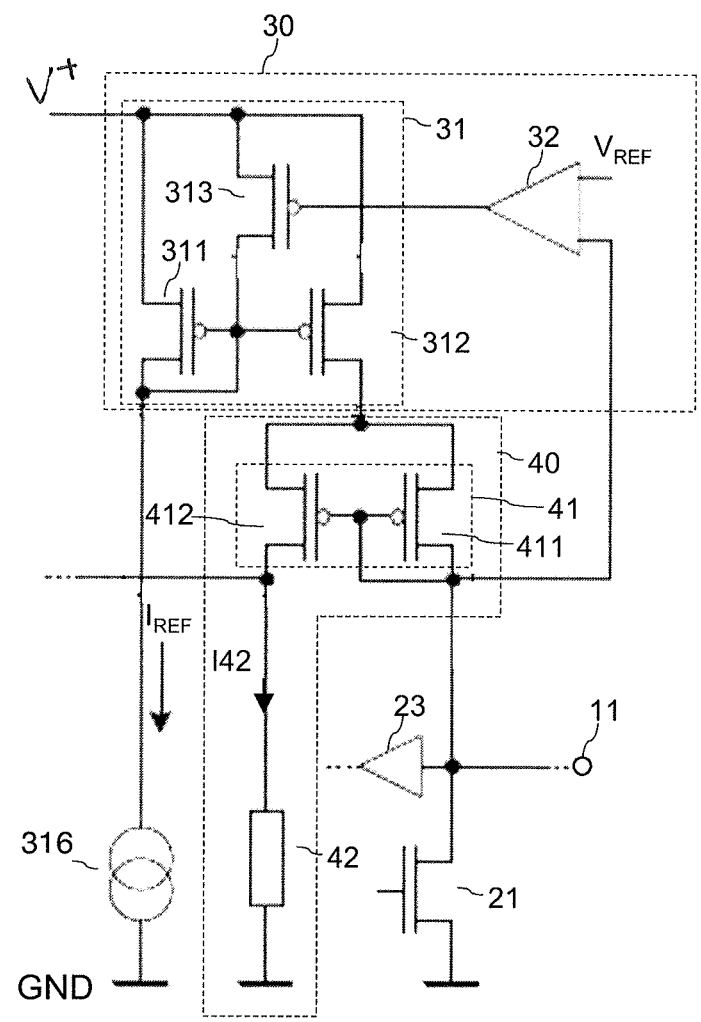
FIG. 7 illustrates a second embodiment of the controlled current source and the current measurement circuit.

In the embodiment illustrated in FIG. 7, like in the embodiment illustrated in FIG. 5, the first current mirror 41 is connected between the current source 30 and the first terminal 11. However, the circuit of FIG. 7 can easily be modified to have the current source 30 connected between the input path of the current mirror and the first terminal 11, like in the embodiment illustrated in FIG. 6.

Figure 8:
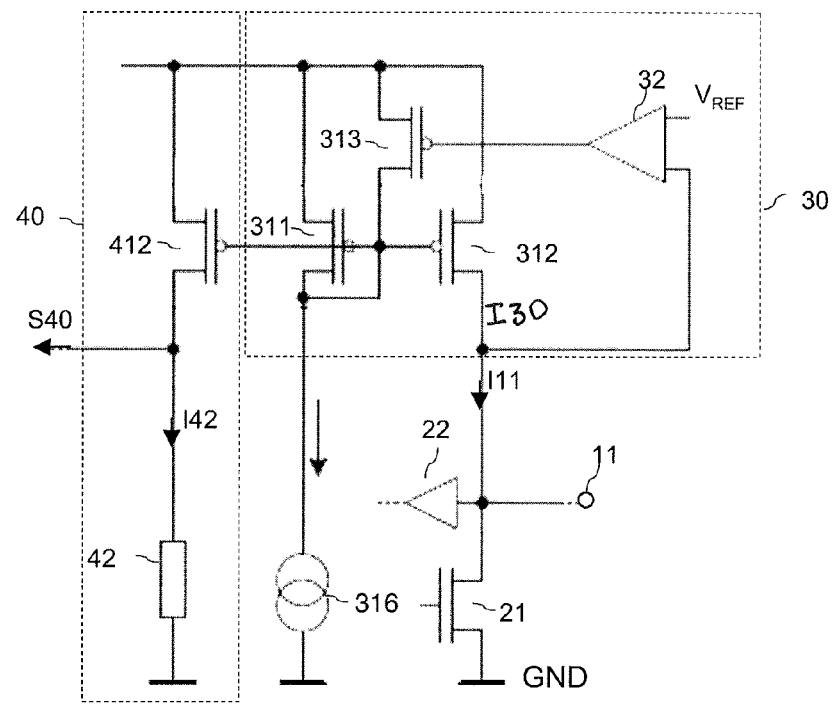
FIG. 8 illustrates a third embodiment of the controlled current source and the current measurement circuit.

FIG. 8 illustrates a further embodiment of the current source 30 and the current measurement circuit 40. The current source 30 is implemented like the current source of FIG. 7 and includes the second current mirror with an input transistor 311, and output transistor 312 and a control transistor 313. In this embodiment, the second current mirror of the current source 30 and the first current mirror of the current measurement circuit have the input transistor 311 in common. Thus, the output transistor 412 of the first current mirror has its control terminal connected to the control terminal of the input transistor 311 and the output transistor 312 of the second current mirror. In this embodiment, the output current I42 through the output transistor 412 is also proportional to the output current I30 of the current source 30, wherein the output current I30, in this embodiment, is equal to the current I11 at the first terminal 11.

Figure 9:
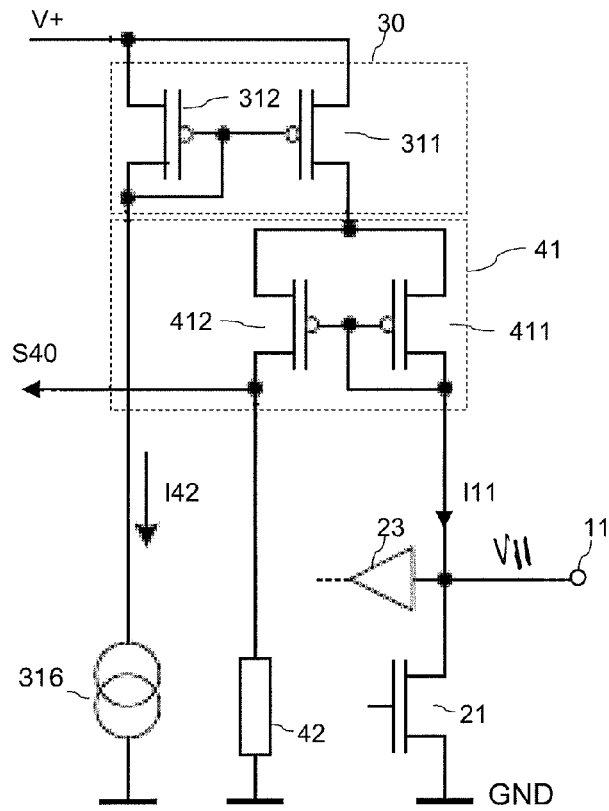
FIG. 9 illustrates a fourth embodiment of the controlled current source and the current measurement circuit.

FIG. 9 illustrates a further embodiment of the controlled current source 30 and the current measurement circuit 40. The circuit is a modification of the circuit illustrated in FIG. 7 and can be obtained from the circuit of FIG. 7 by omitting the feedback loop with the amplifier and the control transistor 313. In this embodiment, the voltage V11 at the first terminal 11 is limited or controlled to a value which is basically defined by the second supply potential V+ minus a residual voltage over the output transistor 312 of the second current mirror and minus the residual voltage over the input transistor 411 of the first current mirror. For small currents I11 the residual voltage over output transistor 312 is close to zero, since this transistor is operated in the linear mode. The residual voltage over input transistor 411 is close to its threshold voltage for small currents I11. When the output voltage V11 rises to a value corresponding to the second supply voltage V+ minus these two residual voltages, the output current of the current source I30 and the current I11 at the first terminal 11 is reduced and settles at a value defined by equation (2), wherein in equation (2) $V11_H$ is to be replaced by the second supply potential V+ minus the residual voltages of the transistors 312, 411.

In the embodiment illustrated in FIG. 9, the first current mirror is connected between the current source 30 and the first terminal 11. However, the circuit can easily be modified to have the current source 30 connected between the current mirror and the first terminal 11, like in the circuit illustrated in FIG. 6.

Figure 10:
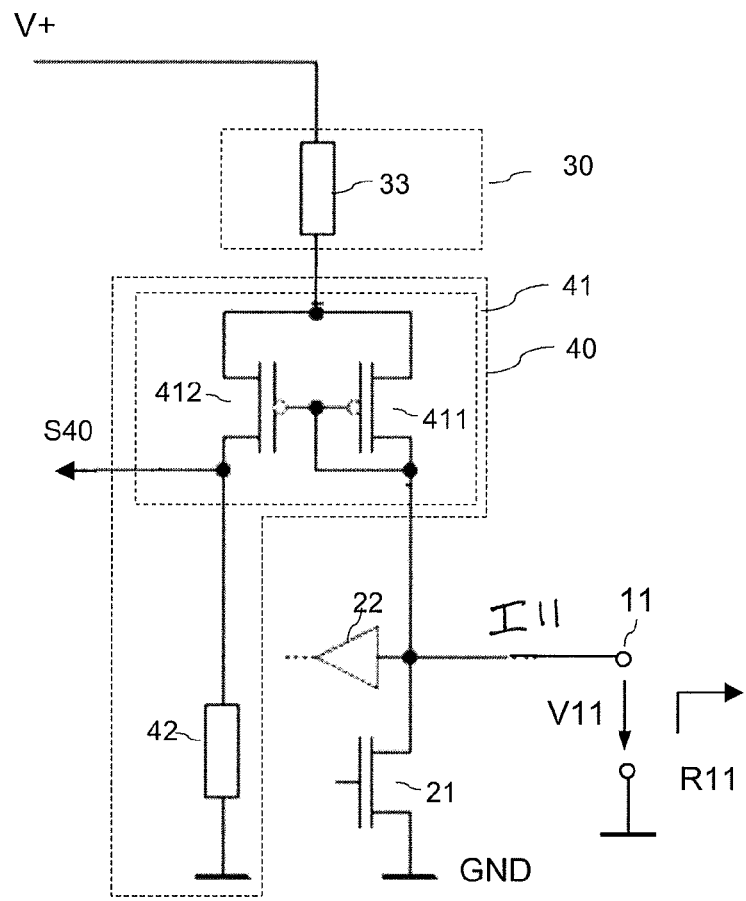
FIG. 10 illustrates a fifth embodiment of the controlled current source and the current measurement circuit.

FIG. 10 illustrates a further embodiment of implementing the current source 30 and the current measurement circuit 40. In this embodiment the current source 30 includes a current source resistor 33. The voltage V11 at the first terminal 11 is limited by the resistive voltage divider formed by the current source resistor 33 and the resistor R11 (formed by the removable components) and by a residual voltage over the input transistor 411 of the first current mirror 41. The first current I11 is determined by the supply voltage between the first and second supply terminals minus the residual voltage over transistor 411 divided by the serial resistance of resistor 33 and the output resistance R11. In this embodiment the first voltage $V11_H$ and the first current I11 are a function of the number of removable components (not shown in FIG. 10) connected to the first terminal 11. However, if the resistance of the resistor 33 is small compared to the output resistance R11 this dependency remains reasonably small. In this embodiment, the current control function of the current source 30 is provided through the resistor 33 itself, wherein the first current I11 decreases when the first voltage V11 increases.

Referring to equations (2) and (5) the current measurement signal S40 which is evaluated by the evaluation circuit (50 in FIG. 3) can assume n different values when the voltage V11 has the second signal value $V11_H$, and the current measurement signal S40 assumes a maximum value $S40_{MAX}$ when the current I11 at the first terminal 11 and the output current I30 of the controlled current source 30 have their maximum values. The current measurement signal S40 assumes a minimum value which is, for example, zero, when the voltage V11 has its second signal level $V11_H$ and when no removable component is connected. Assume, for explanation purposes, that n is the maximum number of removable components that can be connected to the electronic device. In this case, the current measurement signal S40 can assume n+2 different signal values.

Figure 11:
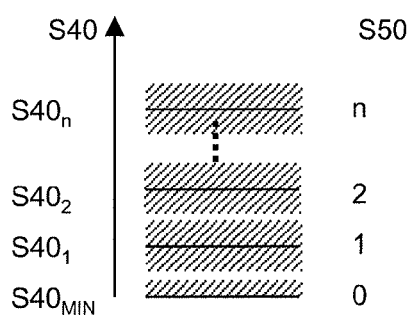
FIG. 11 illustrates the basic operating principle of the evaluation circuit.

The evaluation circuit 50 is configured to evaluate the current measurement signal S40 and to generate the status signal S50 dependent on this evaluation. The basic function of the evaluation circuit 50 will be explained with reference to FIG. 11. FIG. 11 schematically illustrates the n+2 different signal values, the current measurement signal S40 can assume: $S40_{MIN}$, $S40_1$, . . . , $S40_n$, $S40_{max}$. $S40_{MIN}$ denotes the minimum value the current measurement signal S40 assumes when the presence detection circuit 10 is in the presence detection mode, i.e., when the output voltage V11 has the second signal level $V11_H$, and when no removable component is connected to the electronic device. In this case, the current I11 at the first terminal 11 is zero. According to one embodiment $S40_{mIN}$ is also zero in this case. However, this is only an example. The current measurement signal S40 can be dependent on the current I11 at the first terminal 11 according to any linear function like $S40=c+d\cdot I11$, so that the current measurement signal S40 could also assume a signal level other than zero for I11=0. In FIG. 11, $S40_{MAX}$ represents the maximum current $I11_{MAX}$, which is the first current I11 when the presence detection circuit is not in presence detection mode, i.e., when the voltage V11 is less than the second signal value $V11_H$. Referring to equations (2) and (5) the current I11 and, therefore the current measurement signal S40 increases with increasing number of removable components connected to the electronic device. In FIG. 11, the indices at the individual signal values of the current measurement signal S40 represent the number of removable components connected to the electronic device, wherein the current measurement values increase with increasing number of removable components.

In FIG. 11, the information represented by the presence detection signal S50 is also shown. If the current measurement signal S40 is, for example, $S40_1$, than the information represented by the status signal S50 is that one (1) removable component is connected to the electronic device. Since variations in the current measurement signal S40 may occur due to temperature variations or variations in the components used in the circuit, the evaluation circuit 50 is, for example, configured to detect the presence of a particular current measurement signal $S40_i$, when the current measurement signal S40 is in a range of between $S40_i$−r and $S40_i$+r. This is schematically illustrated in FIG. 11 by the areas illustrated in dashed lines.

Figure 12:
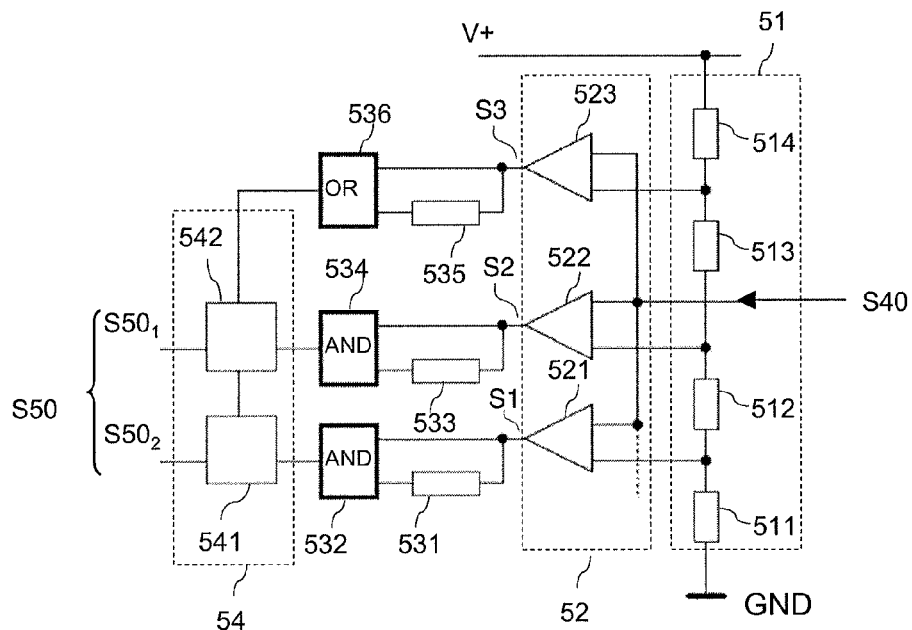
FIG. 12 illustrates an embodiment of the evaluation circuit.

The functionality illustrated in FIG. 11 can be implemented by a plurality of different analog or digital circuits. One embodiment of the evaluation circuit 50 is illustrated in FIG. 12. The evaluation circuit in FIG. 12 is configured to detect four (=n+2) different signal values of the current measurement signal S40. This evaluation circuit 50 is, therefore suitable to be implemented in an electronic device to which a maximum of n=2 removable components can be connected to. However, this is only an example. The evaluation circuit 50 of FIG. 12 can easily be modified to detect the presence of more than n=2 removable components.

Referring to FIG. 12, the evaluation circuit 50 includes a reference voltage generator 51. This reference voltage generator 51 includes a resistive voltage divider with four (=n+2) resistors 511, 512, 513, 514 connected in series between terminals for the first and second reference potentials GND, V+. This reference voltage generator 51 provides three different reference voltages: a first reference voltage V1 across the first resistor 511; a second reference voltage V2 across the series circuit with the first and second resistors 511, 512; and a third reference voltage V3 across the series circuit with the first, second and third resistors 511, 512, 513.

A comparator stage 52 receives the reference voltage V1, V2, V3. This comparator stage includes three comparators: a first comparator 521 which compares the current measurement signal S40, which in this embodiment is a voltage, with the first reference voltage V1; a second comparator 522 which compares the current measurement signal S40 with the second reference voltage V2; and a third comparator 523 which compares the current measurement signal S40 with the third reference voltage V3. Each of these comparators 521, 522, 523 provides a comparator signal S1, S2, S3. A first comparator signal S1 at the output of the first comparator 521 indicates whether the current measurement signal S40 is below or above the first reference voltage V1; the second comparator signal S2 at the output of the second comparator 522 indicates whether the current measurement signal S40 is below or above the second reference voltage V2; and the third comparator signal S3 at the output of the third comparator 523 indicates whether the current measurement signal S40 is below or above the third reference voltage V3. For explanation purposes it is assumed that the comparator signals S1, S2, S3 have a high signal level when the current measurement signal S40 is higher than the corresponding reference voltage V1, V2, V3 received by the individual comparator 521, 522, 523. The reference voltages V1, V2, V3 define signal ranges which allow the evaluation of whether the circuit is in the presence detection mode and, if the circuit is in the presence detection mode, allow the evaluation of how many removable components are connected to the electronic device.

In the embodiment illustrated in FIG. 12, the circuit in the presence detection mode when the current measurement signal S40 is below the third reference voltage V3, i.e., when the third comparator signal S3 has a low signal level. In the presence detection mode, a current measurement signal S40 below the first reference voltage V1 indicates that no removable component (n=0) is connected to the electronic device. In this case, the three comparator signals S1-S3 each have a low signal level. A current measurement signal S40 higher than the first reference voltage V1 and lower than the second reference voltage V2 indicates that one (n=1) removable component is connected to the electronic device. In this case, the first comparator signal S1 has a high level, and the second and third comparator signal S2, S3 have a low level. A current measurement signal S40 higher than the second reference voltage V2 indicates that two (n=2) removable components are connected to the electronic device. In this case, the first and second comparator signals, S1, S2 have a high level, while the third comparator signal S3 has a low level.

When the circuit is not in the presence detection mode, the current measurement signal S40 has its maximum. In this case, the current measurement signal S40 is higher than the third reference voltage V3. In this case, each of the three comparator signals S1-S3 has a high level.

The evaluation circuit 50 of FIG. 12 generates a status signal S50 with two sub-signals: $S50_1$, $S50_2$. These two sub-signals together include the information on the number of removable components connected to the electronic device. These two signals are dependent on the three comparator signals S1, S2, S3. In the evaluation circuit of FIG. 12, the third comparator signal S3 indicates whether or not the circuit is in the presence detection mode. The circuit is in the presence detection mode, when the third comparator signal S3 has a low level, and the circuit is not in the presence detection mode, when the third comparator signal S3 has a high level. When the circuit is in the presence detection mode, the first and second comparator signal S1, S2 indicate the number of removable components connected to the electronic device.

The evaluation circuit 50 includes an output stage 54 which is configured to allow the sub-signals $S50_1$, $S50_2$ to change only when the circuit is in the presence detection mode, i.e., when the third comparator signal S3 has a low signal level. This output stage 54 includes two latches 541, 542 each having a data input, a data output and an enable input. Each of these latches 541, 542 is configured to store a signal value provided at its data input and to provide the stored signal value at the data output. The output signals of the latches 541, 542 follow their input signals, when the circuit is in the presence detection mode, and the latches keep the stored signal values and prevent the stored signal values from being changed, when the circuit is not in the presence detection mode, i.e., when the third comparator signal S3 has a high signal level. Thus, the third comparator 523 output signal enables or disables the output stage with the two latches 541, 542 to change the status signal S50$_1$, S50$_2$ dependent on the input signals received at the input of the output stage. The third comparator 523 can also be referred to as enable comparator, which enables the output stage 541, 542 to change its signal value each time, the third comparator signal S3 indicates that the current measurement signal S40 is below the third reference voltage V3. The third reference voltage V3 can also be referred to as enable reference signal.

When the circuit changes into the presence detection mode, i.e., when the voltage V11 at the first terminal 11 is allowed to increase, the controlled voltage source 30 at the beginning provides its maximum current I30$_{MAX}$, wherein the current finally decreases to a value which represents the number of removable components connected to the electronic device. For explanation purposes it is at first assumed that no removable device is connected, so that the first current I11 and, therefore, the current measurement signal S40, finally decreases to zero. In this case, the current measurement signal S40 first falls below the third reference voltage V3, then below the second reference voltage V2, and then below the first reference voltage V1. Consequently, first the third comparator signal S3 has a falling edge, then the second comparator signal S2 has a falling edge, and finally the first comparator signal S1 has a falling edge. In order to prevent the status signal S50 (which includes the sub-signals S50$_1$, S50$_2$) to change its signal state before the first current I11 has reached its final signal value after the circuit has changed into the present detection state the evaluation circuit 50 has optional delay units.

These delay units are connected between the outputs of the comparators 521, 522, 523 and the data inputs of the latches 541, 542. When the circuit is in the presence detection mode and leaves the presence detection mode (when, for example, one of the modulation transistors is switched on) the first current I11 increases. Consequently, the current measurement signal S40 increases, wherein first the first reference voltage V1, then the second reference voltage V2 and finally the third reference voltage V3 is reached. The delay units are configured to prevent the presence detection signal S50 from changing its signal stage during these transition periods. For this, first and second delay units connected between the first and second comparators 521, 522 and the latches 541, 542 delay rising edges of the first and second comparator signals S1, S2, and the third delay unit connected between the third comparator 523 and the enable inputs of the latches 541, 542 delay falling edges of the third comparator signal S2. The delay times are selected such the delays correspond to the transition periods of the current I11 and the current measurement signal S40. The transition period is the period between the time when the current I11 has its maximum value and the time when this current I11 has reached its final signal value in the presence detection mode.

The first and second delay units each include an AND-Gate 532, 534 which receives the corresponding comparator output signal S1, S2 at a first input, and which receives a delayed comparator signal at a second input, wherein the comparator signal S1, S2 is delayed by a delay element 531, 533. The third delay unit instead of the AND-Gates includes an OR-Gate 536, which receives the third comparator signal S3 at a first input and which receives a delayed version of the third comparator signal S3 at a second input. A delay element 535 delays the third comparator signal S3.

The first delay unit provides a first delayed comparator signal S1', and the second delay unit provides a second delayed comparator signal S2'. The first and second delayed comparator signals S1', S2' correspond to the first and second comparator signals S1, S2, wherein falling edges of the delayed signals S1', S2' are delayed relative to the falling edges of the first and second comparator signals S1, S2. The third delay unit provides a third delay comparator signal S3', which corresponds to the third comparator signal S3 with the difference, that the falling edge of the delayed signal S3' is delayed relative to the falling edge of the third comparator signal S3.

Figure 13:
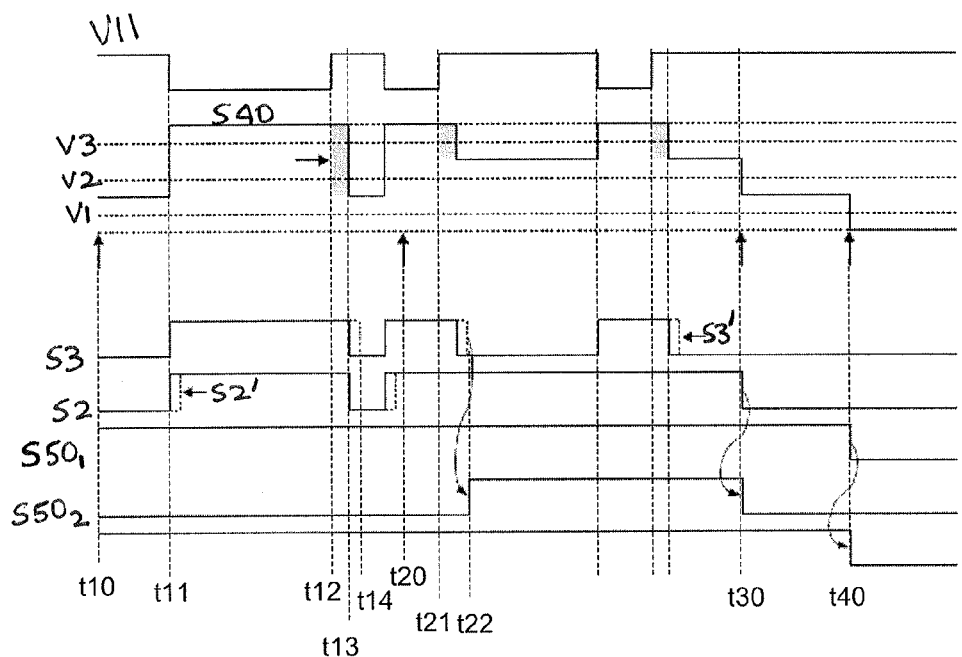
FIG. 13 shows timing diagrams illustrating the operating principle of the evaluation circuit of FIG. 12.

The operating principle of the evaluation circuit 50 of FIG. 12 will be explained with reference to FIG. 13, in which timing diagrams of the first voltage V11, the first current I11 or the current measurement signal S40, respectively, the comparator signals S1-S3 and the delayed comparator signals S1'-S3', respectively, and the status signal S50 are illustrated. Referring to FIG. 13, the output voltage V11 has a sequence of high and low signal levels, wherein this sequence of high and low levels represents an information to be transmitted between the electronic device and a removable component and is defined by one of the communication circuits (see, e.g., 20, 92 in FIG. 1) connected to the first terminal 11. During the time period which is represented by the timing diagrams in FIG. 13, the number of removable components connected to the electronic device changes four times: at a first time t10 one component is connected to the device; at a second time t20 a second component is added, so that two components are connected to the device; at a third time t30 one of the two components is removed, to that only one component is left; and at a fourth time t40 the remaining component is removed, so that finally no component is connected to the electronic device. At the first time t10 the circuit is in the presence detection mode, i.e., the output voltage V11 has a high level and the current I11 and the current measurement signal S40, respectively, represent the number of components connected to the electronic device. At the time t10 the current measurement signal S40 is between the first and second reference voltages V1, V2. Consequently, the first comparator signal S1 has a high level and the second comparator signal S2 has a low level. Consequently, the first sub-signal S50$_1$ has a high level and the second sub signal S50$_2$ has a low level indicating a number of n=1 removable components connecting to the device.

At a time t11 after the first time t10 the output voltage V11 falls to a low level so that the current I11 and the current measurement signal S40 increase. At time t11 the current measurement signal S40 reaches the third reference voltage V3, so that the third comparator signal S3 reaches a high level and "locks" the latches 541, 542 so that they "keep" their output signals S50$_1$, S50$_2$. The rising edge of the second comparator signal S2 is delayed (see the dotted line in FIG. 13 which represents the delayed signal S2'). This ensures that the output signal of the second latch 541 can not change its signal state before the latches are locked. At a time t12 the output voltage V11 is again allowed to rise. Due to charging processes the current measurement signal S40 does not immediately drop to its final value, but there is a delay time, so that at a later time t13 the current measurement signal S40 falls below the third and second threshold voltages V2, V3. Since the falling edge of the comparator signal S3 is delayed, the latches are "unlocked" at a later time t14. When the latches are unlocked at time t14 the latches store the signal values provided at their data inputs. However, since there has been no change in the number of removable components connected to the electronic device, there is no change in the status signal S50.

Although a change in the number of connected removable devices occurs at time t20, this change is not immediately represented by the status signal S50, because at the second time t20 the circuit is not in the presence detection mode. The circuit enters the presence detection mode at a later time t21 at which the output voltage V11 is allowed to increase. After this time t21 the current measurement signal S40 falls to a signal value which is between the second and the third reference voltages V2, V3. At time t22, at which the latches 541, 542, are unlocked, the second sub-signal $S50_2$ assumes a high-level while the first sub signal $S50_1$ keeps its high-level. The two high-levels of the first and second sub signals $S50_1$, $S50_2$ represent a number of n=2 removable components connected to the electronic device.

At the third time t30, when one of the removable components is removed, the electronic circuit is in the presence detection mode, so that almost immediately at the third time t30 the current measurement signal S40 falls to a signal level which is between the first and second reference voltage V1, V2. Similarly, at the fourth time t40, when the last removable component is removed, the circuit is also in the presence detection mode, so that almost immediately at time t40 the current measurement signal S40 falls below the first reference voltage V1.

Finally it should be mentioned, that features explained with reference to one embodiment can, of course, be combined with features of other embodiments, even if this has not explicitly been mentioned herein before.

What is claimed is:

1. An electronic circuit, comprising:
   a first terminal for connecting a plurality of accessories thereto;
   a transmitter or receiver circuit connected to the first terminal;
   a controlled current source comprising an output coupled to the first terminal and configured to drive a current into the first terminal, the current being dependent on an electrical potential at the first terminal;
   a current measurement circuit coupled to the controlled current source, and configured to measure a current at the first terminal and to provide a current measurement signal that is representative of the current at the first terminal; and
   an evaluation circuit receiving the current measurement signal and configured to generate a status signal dependent on the current measurement signal, wherein the status signal indicates whether or not one or more of the plurality of accessories are connected to the electronic circuit.

2. The electronic circuit of claim 1,
   wherein the controlled current source is configured to provide a controlled output current at its output,
   wherein the output current is selected from a current range ranging from a minimum current value to a maximum current value, and
   wherein the controlled current source is configured to provide the output current such that a voltage at the first terminal is limited to a given maximum voltage value.

3. The electronic circuit of claim 1, wherein the current measurement circuit comprises:
   a first current mirror having an input current path and having an output current path, wherein the input current path is connected in series with the controlled current source; and
   an impedance connected in series with the output current path,
   wherein the evaluation circuit is coupled to the impedance.

4. The electronic circuit of claim 3, wherein the input current path is connected between the controlled current source and the first terminal.

5. The electronic circuit of claim 4, wherein the input current path and the output current path are connected in series with the controlled current source.

6. The electronic circuit of claim 3, wherein the input current path is connected between a terminal for supply potential and the controlled current source.

7. The electronic circuit of claim 1, wherein the controlled current source comprises:
   a controllable current source having a current output coupled to the output of the controlled current source and a control input; and
   a feedback loop coupled between the first terminal and the control input.

8. The electronic circuit of claim 7, wherein the feedback loop comprises an amplifier having a first input coupled to the first terminal, a second input receiving a reference voltage, and an output connected to the control input.

9. The electronic circuit of claim 1, wherein the controlled current source comprises:
   a reference current source; and
   a second current mirror with an input current path connected in series with the reference current source, and an output current path coupled to the output of the controlled current source.

10. The electronic circuit of claim 9, wherein the controlled current source is coupled to the first terminal only via the output.

11. The electronic circuit of claim 9, wherein the second current minor further comprises:
    an input transistor having a control terminal, and having a load path forming the input current path;
    an output transistor having a control terminal coupled to the control terminal of the input transistor, and having a load path forming the output current path; and
    a feedback loop coupled between the first terminal and the control terminals of the input and the output transistors.

12. The electronic circuit of claim 3, wherein the controlled current source comprises:
    a reference current source; and
    a second current mirror with an input current path connected in series with the reference current source, and an output current path coupled to the output of the controlled current source;
    wherein the first and second current mirrors have a common input current path.

13. The electronic circuit of claim 12, wherein the second current minor further comprises:
    an input transistor having a control terminal, and having a load path forming the input current path;
    an output transistor having a control terminal coupled to the control terminal of the input transistor, and having a load path forming the output current path; and
    a feedback loop coupled between the first terminal and the control terminals of the input and the output transistors.

14. The electronic circuit of claim 1, wherein the accessory is a removable component.

15. The electronic circuit of claim 1, wherein the plurality of accessories comprise a transmitter and/or receiver circuit configured for data communication via a single line.

16. The electronic circuit of claim 1, wherein the plurality of accessories comprise a transmitter and/or receiver circuit configured for data communication, wherein the transmitter and/or receiver circuit is configured to modulate a voltage at the first terminal.

17. The electronic circuit of claim 1, wherein the plurality of accessories comprise a transmitter and/or receiver circuit configured for data communication, wherein the transmitter and/or receiver circuit is configured to receive/detect an output voltage at the first terminal.

18. An electronic circuit comprising:
a first terminal for connecting an accessory thereto;
a transmitter or receiver circuit connected to the first terminal;
a controlled current source comprising an output coupled to the first terminal and configured to drive a current into the first terminal, the current being dependent on an electrical potential at the first terminal;
a current measurement circuit configured to measure a current at the first terminal and to provide a current measurement signal that is representative of the current at the first terminal; and
an evaluation circuit receiving the current measurement signal and configured to generate a status signal dependent on the current measurement signal, wherein the evaluation circuit comprises:
a first comparator stage configured to compare the current measurement signal with a first reference signal and configured to provide a first comparator signal dependent on the comparison result; and
an output stage having at least one input for receiving the first comparator signal or a signal dependent on the first comparator signal, and configured to provide the status signal dependent on a signal received at the at least one input.

19. The electronic circuit of claim 18, wherein the evaluation circuit further comprises:
an enable comparator stage configured to compare the current measurement signal with an enable reference signal and to provide an enable comparator signal; and
an enable input of the output stage at which the enable reference signal or a signal dependent on the enable reference signal is received;
wherein the output stage is configured to provide the status signal dependent on the signal received at the at least one first input and dependent on the signal received at the enable input.

20. The electronic circuit of claim 18, wherein the evaluation circuit further comprises:
a first delay stage connected between the first comparator stage and the output stage and configured to delay at least one of a rising and a falling edge of the first comparator signal.

21. The electronic circuit of claim 18, further comprising:
at least one further comparator stage configured to compare the current measurement signal with a further reference signal and to provide a further comparator signal; and
a further input of the output stage receiving the further comparator signal or a signal dependent on the further comparator signal;
wherein the output stage is configured to also generate the status signal dependent on the signal received at its further input.

22. The electronic circuit of claim 21, wherein the status signal comprises at least two sub-signals including a first sub-signal that is dependent on the signal received at the first input of the output stage and a further sub-signal that is dependent on the signal received at the further input of the output stage.

23. An electronic circuit, comprising:
a first terminal for connecting a plurality of removable components thereto;
a transmitter or receiver circuit connected to the first terminal;
a voltage controller comprising an output coupled to the first terminal and configured to drive a current into the first terminal such that a voltage at the first terminal assumes a reference value, wherein the current is limited to a maximum current;
a current measurement circuit coupled to the voltage controller, and configured to measure a current at the first terminal and to provide a current measurement signal that is representative of the current at the first terminal; and
an evaluation circuit receiving the current measurement signal and configured to generate a status signal dependent on the current measurement signal, wherein the status signal indicates whether or not one or more of the plurality of removable components are connected to the electronic circuit.

24. An electronic circuit comprising:
a first terminal for connecting an accessory thereto;
a transmitter or receiver circuit connected to the first terminal;
a voltage controller comprising an output coupled to the first terminal and configured to drive a current into the first terminal such that a voltage at the first terminal assumes a reference value, wherein the current is limited to a maximum current;
a current measurement circuit coupled to the voltage controller, and configured to measure a current at the first terminal and to provide a current measurement signal that is representative of the current at the first terminal; and
an evaluation circuit receiving the current measurement signal and configured to generate a status signal dependent on the current measurement signal, wherein the evaluation circuit comprises
a first comparator stage configured to compare the current measurement signal with a first reference signal and configured to provide a first comparator signal dependent on the comparison result, and
an output stage having at least one input for receiving the first comparator signal or a signal dependent on the first comparator signal, and configured to provide the status signal dependent on a signal received at the at least one input.

25. An electronic circuit, comprising:
a first terminal for connecting an accessory thereto;
a transmitter or receiver circuit connected to the first terminal;
a controlled current source comprising an output coupled to the first terminal and configured to drive a current into the first terminal, the current being dependent on an electrical potential at the first terminal;
a current measurement circuit coupled to the controlled current source, and configured to measure a current at the first terminal and to provide a current measurement signal that is representative of the current at the first terminal; and
an evaluation circuit receiving the current measurement signal and configured to generate a status signal dependent on the current measurement signal, wherein the status signal indicates whether or not the accessory is connected to the electronic circuit; and wherein the accessory comprises a transmitter and/or receiver circuit configured for data communication, wherein the transmitter and/or receiver circuit is configured to modulate a voltage at the first terminal and/or receive/detect an output voltage at the first terminal.

* * * * *

UNITED STATES PATENT AND TRADEMARK OFFICE
CERTIFICATE OF CORRECTION

PATENT NO. : 8,872,505 B2  
APPLICATION NO. : 12/914261  
DATED : October 28, 2014  
INVENTOR(S) : Wolfgang Furtner Page 1 of 1

It is certified that error appears in the above-identified patent and that said Letters Patent is hereby corrected as shown below:

On the Title Page, item (73) Assignee, line 1, delete "Infineon Technologies AG," and insert --Infineon Technologies Austria AG,--.

In the Claims,
In Col. 16, line 32, claim 11, delete "minor" and insert --mirror--.
In Col. 16, line 50, claim 13, delete "minor" and insert --mirror--.

Signed and Sealed this
Eighteenth Day of August, 2015

Michelle K. Lee
*Director of the United States Patent and Trademark Office*